(12) United States Patent
Blackwell et al.

(10) Patent No.: US 7,800,916 B2
(45) Date of Patent: Sep. 21, 2010

(54) CIRCUITIZED SUBSTRATE WITH INTERNAL STACKED SEMICONDUCTOR CHIPS, METHOD OF MAKING SAME, ELECTRICAL ASSEMBLY UTILIZING SAME AND INFORMATION HANDLING SYSTEM UTILIZING SAME

(75) Inventors: Kim J. Blackwell, Owego, NY (US);
Frank D. Egitto, Binghamton, NY (US);
John M. Lauffer, Waverly, NY (US);
Voya R. Markovich, Endwell, NY (US)

(73) Assignee: Endicott Interconnect Technologies, Inc., Endicott, NY (US)

(*) Notice: Subject to any disclaimer, the term of this patent is extended or adjusted under 35 U.S.C. 154(b) by 830 days.

(21) Appl. No.: 11/783,306

(22) Filed: Apr. 9, 2007

(65) Prior Publication Data

US 2008/0244902 A1    Oct. 9, 2008

(51) Int. Cl.
*H01R 12/16* (2006.01)

(52) U.S. Cl. .................. 361/790; 361/760; 361/763; 361/782; 361/792

(58) Field of Classification Search ......... 361/763–766, 361/790; 257/685–686
See application file for complete search history.

(56) References Cited

U.S. PATENT DOCUMENTS

| | | |
|---|---|---|
| 4,956,694 A | 9/1990 | Eide |
| 5,016,085 A | 5/1991 | Hubbard et al. |
| 5,099,309 A | 3/1992 | Kryzaniwsky |
| 5,207,585 A | 5/1993 | Byrnes et al. |
| 5,280,192 A | 1/1994 | Kryzaniwsky |
| 5,426,263 A | 6/1995 | Potter et al. |
| 5,786,986 A * | 7/1998 | Bregman et al. ............ 361/719 |
| 5,831,833 A | 11/1998 | Shirakawa et al. |
| 6,084,306 A | 7/2000 | Yew et al. |
| 6,156,484 A | 12/2000 | Bassous et al. |
| 6,242,282 B1 | 6/2001 | Fillion et al. |
| 6,388,204 B1 | 5/2002 | Lauffer et al. |
| 6,413,798 B2 * | 7/2002 | Asada ....................... 438/108 |
| 6,437,240 B2 | 8/2002 | Smith |
| 6,479,093 B2 | 11/2002 | Lauffer et al. |
| 6,483,718 B2 * | 11/2002 | Hashimoto ................. 361/803 |
| 6,593,534 B2 | 7/2003 | Jones et al. |
| 6,704,207 B2 | 3/2004 | Kopf |
| 6,881,072 B2 | 4/2005 | Egitto et al. |
| 7,011,532 B2 | 3/2006 | Hembree et al. |
| 7,023,707 B2 | 4/2006 | Fraley et al. |
| 7,035,113 B2 | 4/2006 | Fraley et al. |

* cited by examiner

*Primary Examiner*—Tuan T Dinh
(74) *Attorney, Agent, or Firm*—Mark Levy; Hinman, Howard & Kattell; Lawrence R. Fraley (57) ABSTRACT

A circuitized substrate assembly comprised of at least two circuitized substrates each including a thin dielectric layer and a conductive layer with a plurality of conductive members as part thereof, the conductive members of each substrate being electrically coupled to the conductive sites of a semiconductor chip. A dielectric layer is positioned between both substrates and the substrates are bonded together, such that the chips are internally located within the assembly and oriented in a stacked orientation. A method of making such an assembly is also provided, as is an electrical assembly utilizing same and an information handling system adapted for having such an electrical assembly as part thereof.

31 Claims, 4 Drawing Sheets

CIRCUITIZED SUBSTRATE WITH INTERNAL STACKED SEMICONDUCTOR CHIPS, METHOD OF MAKING SAME, ELECTRICAL ASSEMBLY UTILIZING SAME AND INFORMATION HANDLING SYSTEM UTILIZING SAME

TECHNICAL FIELD

This invention relates to circuitized substrates, and more particularly to composite circuitized structures such as printed circuit boards (PCBs), chip carriers, and the like. The present invention also relates to methods for fabricating such structures, electrical assemblies (e.g., PCB-chip carrier assemblies) utilizing same, and to information handling systems (e.g., computers, servers, etc.) utilizing such substrates and/or assemblies. More particularly, the invention relates to such substrates and methods in which at least one microprocessor (semiconductor chip) is utilized as part of the substrate.

CROSS REFERENCE TO CO-PENDING APPLICATIONS

In Ser. No. 10/900,385, filed Jul. 28, 2004, there is defined a circuitized substrate comprised of at least one dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof.

In Ser. No. 10/900,386, also filed Jul. 28, 2004, there is defined an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. Ser. No. 10/900,386 is now U.S. Pat. No. 7,045,897.

In Ser. No. 11/110,901, filed Apr. 21, 2005, there is defined an interposer comprising at least two dielectric layers bonded to each other, sandwiching a plurality of conductors therebetween. The conductors each electrically couple a respective pair of opposed electrical contacts formed within and protruding from openings with the dielectric layers. The interposer is ideally suited for use as part of a test apparatus to interconnect highly dense patterns of solder ball contacts of a semiconductor chip to lesser dense arrays of contacts on the apparatus's printed circuit board. The interposer is also capable of being used for other purposes, including as an interconnecting circuitized substrate between a semiconductor chip and a chip carrier substrate or between a chip carrier and a printed circuit board. Various methods of making such an interposer are also provided.

All of the above applications are assigned to the same Assignee as the present invention.

BACKGROUND OF THE INVENTION

A conventional approach to forming laminate circuitized substrates (e.g., PCBs) involves forming layers of dielectric material and electrically conducting material to provide multiple layers of circuits and voltage planes. Circuits can be discrete wiring patterns known as signal planes. Reference planes can be either ground planes or voltage planes, and are sometimes collectively referred to as power planes. In one technique of forming such structures, layers of dielectric material and conductive material are successively applied, e.g., the dielectric material is applied and then circuits or power planes are provided thereon and, typically, thru-holes (described in greater detail hereinbelow) are formed, typically by drilling or etching. This method relies on each successive step of adding additional structure and the circuitry layers are formed individually, e.g., in each step in forming the plane having circuit traces or formed power planes. Precise drilling is required to form the plated thru-holes (PTHs), which is time consuming, especially where there are a large number of drilled holes required to form the PTHs.

Methods have been recently described that provide a relatively inexpensive photolithographic technique of forming a composite laminate structure (substrate assembly) from individual discrete laminate structures (substrates). For example, see U.S. application Ser. No. 09/812,261, entitled "Printed Wiring Board Structure With Z-Axis Interconnections", filed Mar. 19, 2001. Ser. No. 09/812,261 is now U.S. Pat. No. 6,593,534. See also U.S. Pat. Nos. 6,388,204 (Lauffer et al) and 6,479,093 (Lauffer et al).

As part of the manufacture of double-sided and multilayer PCBs, it is necessary to provide the aforementioned thru-holes between the various conductive layers or sides of the board. This is commonly achieved by providing metallized, conductive thru-holes in the board which communicate with the sides and layers requiring electrical interconnection. For some applications, it is desired that electrical connection be made with many and perhaps all of the conductive layers. In such a case, thru-holes are also typically provided through the entire thickness of the board. For these, as well as other applications, it is often desired to also provide electrical connection between the circuitry on one face of the board and one or more of the inner circuit layers. In those cases, "blind vias", passing only part way through the board are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. For purposes of this application, therefore, the term "thru-hole" is meant to include such conductive openings that pass entirely through the board (plated through holes or PTHs), "blind vias" which extend from an external surface of the board into a specified conductive layer of the board, as well as "internal vias" which is internally "captured" by the board's outer layers.

The complexity of circuitized substrates such as PCBs has increased significantly over the past few years, due primarily to increased operational requirements for the products in which these substrates are utilized. For example, boards for mainframe computers may have as many as thirty-six layers of circuitry or more, with the complete stack having a thickness of as much as 0.250 inch (or 250 mils, a mil being one thousandths of an inch). These boards are typically designed with three or five mil wide signal lines and twelve mil diameter thru-holes. For increased densification in many of today's PCBs, the industry seeks to reduce signal lines to a width of two mils or less and thru-holes to a diameter of two mils or less.

As will be defined herein in greater detail, a primary feature of the instant invention is the provision of a circuitized substrate possessing much greater operational (especially microprocessing) capabilities than such substrates and electrical assemblies utilizing same as known in the art. A specific feature of the invention is the inclusion of two or more semiconductor chips within the substrate proper, thereby eliminating the need for externally mounted components of this type and thereby saving more surface space for signal lines, and other components such as capacitors, resistors, etc. Yet another feature, according to one embodiment, is to provide such a substrate which is capable of having many of the aforementioned thru-holes therein, e.g., for interconnecting selected ones of the chips and/or conductive lines/planes which also may form part of the substrate. Yet another feature is to provide such a structure which may include one or more electrical components, e.g., ASIC chips, network processors or RF die mounted thereon to thus give the final assembly still greater micro-processing capabilities.

The following is a list of various U.S. Patents which describe circuitized substrates, including some which also include semiconductor chips as part thereof, including positioned thereon in stacked orientation. This list is not meant to be all-inclusive however, as it is fully understood that there are many additional patents which also describe other substrates. The following is thus meant only to be representative of some of those known in the art. The listing of the patents in the listing below, and the patents and applications mentioned above, is not an admission that any of those identified are prior art to the present invention.

In U.S. Pat. No. 7,035,113, entitled "Multi-chip Electronic Package Having Laminate Carrier And Method Of Making Same', issued Apr. 25, 2006, there is defined a multi-chip electronic package which utilizes an organic, laminate chip carrier and a plurality of semiconductor chips positioned on an upper surface of the carrier. The organic, laminate chip carrier is comprised of a plurality of conductive planes and dielectric layers and couples the chips to underlying conductors on the bottom surface thereof. The carrier may include a high-speed portion to assure high-frequency connection between the semiconductor chips and may also include an internal capacitor and/or thermally conductive member for enhanced operational capabilities. The chips may be "stacked" one atop the other or positioned vertically and parallel to one another.

In U.S. Pat. No. 7,023,707, entitled "Information Handling System", issued Apr. 4, 2006, there is defined an information handling system, e.g., computer, server or mainframe, which includes a multi-chip electronic package utilizing an organic, laminate chip carrier and a plurality of semiconductor chips positioned on an upper surface of the carrier. The chips may be "stacked" one atop the other or positioned vertically and parallel to one another. The organic, laminate chip carrier is comprised of a plurality of conductive planes and dielectric layers and couples the chips to underlying conductors on the bottom surface thereof. The carrier may include a high-speed portion to assure high-frequency connection between the semiconductor chips and may also include an internal capacitor and/or thermally conductive member for enhanced operational capabilities of the final system product.

In U.S. Pat. No. 7,011,531, entitled "Membrane Probe With Anchored Elements", issued Mar. 14, 2006, there is described a structure and method to establish an electrical connection between a tester and an electrical component. A flexible dielectric layer has a first side and a second side. A through via extends through the first side and the second side of the dielectric layer. A blind via is placed in a position that is offset from the through via and extends laterally in a first direction from a section of the first through via to a section of the flexible dielectric layer. The blind via extends in a second direction from the first side of the flexible dielectric layer to a section of the flexible dielectric layer that is between the first side and the second side of the dielectric layer. An electrically conductive member extends through the through via and extends into the blind via, thereby filling the through via and the blind via. The electrically conductive member has a first surface and a second surface. Any distance between the first surface and the second surface is greater than a distance between the first side of the dielectric layer and the second side of the dielectric layer. U.S. Pat. No. 7,011,531 is a divisional application of U.S. Pat. No. 6,881,072, below.

In U.S. Pat. No. 6,881,072, entitled "Membrane Probe With Anchored Elements", issued Apr. 19, 2005, there is described a structure and method to establish an electrical connection between a tester and an electrical component. A flexible dielectric layer has a first side and a second side. A through via extends through the first side and the second side of the dielectric layer. A blind via is placed in a position that is offset from the through via and extends laterally in a first direction from a section of the first through via to a section of the flexible dielectric layer. The blind via extends in a second direction from the first side of the flexible dielectric layer to a section of the flexible dielectric layer that is between the first side and the second side of the dielectric layer. An electrically conductive member extends through the through via and extends into the blind via, thereby filling the through via and the blind via. The electrically conductive member has a first surface and a second surface. Any distance between the first surface and the second surface is greater than a distance between the first side of the dielectric layer and the second side of the dielectric layer.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,437,240, entitled "Microelectronic Connections With Liquid Conductive Elements", issued Aug. 20, 2002, there is described a method of making a microelectronic assembly includes providing a first microelectronic element and a second microelectronic element with confronting, spaced-apart surfaces defining a space there-between and providing one or more masses of a fusible conductive material having a melting temperature below about 150 degrees Celsius (hereinafter also referred to simply as "C") in said space, whereby the fusible conductive masses connect the first and second microelectronic elements to one another. Next, a flowable material is introduced between the confronting surfaces of the first and second microelectronic elements and around the one or more fusible conductive masses and the flowable material is then cured to provide a compliant layer disposed between said confronting surfaces and intimately surrounding each fusible conductive mass. The fusible conductive masses are capable of electrically interconnecting the contacts on microelectronic elements confronting one another and/or conducting heat between confronting microelectronic elements.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multi-layer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photosensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multilayered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,207,585, entitled "Thin Interface Pellicle For Dense Arrays Of Electrical Interconnects", issued May 4, 1993, there is described a thin interface pellicle probe for making temporary or permanent interconnections to pads or bumps on a semiconductor device wherein the pads or bumps may be arranged in high density patterns. The pellicle is described as incorporating an electrode for each pad or bump wherein the electrode has a raised portion thereon for penetrating the surface of the pad or bump to create sidewalls to provide a clean contact surface and the electrode has a recessed surface to limit the penetration of the raised portion. The electrodes may be affixed to a thin flexible membrane to permit each contact to have independent movement over a limited distance and of a limited rotation. The design allegedly overcomes the problem of making easily breakable electrical interconnections to high density arrays of pads or bumps on integrated circuit structures for testing, burn-in or package interconnect and testing applications.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess.

In U.S. Pat. No. 4,956,694, entitled "Integrated circuit chip stacking", issued Sep. 11, 1990, there is described a device for increasing the density of integrated circuit chips on a printed circuit board. A plurality of integrated circuits are packaged within chip carriers and stacked, on one top of the other, on a printed circuit board. Each of the input/output data terminals, power and ground terminals of the chips are connected in parallel. Each chip is individually accessed by selectively enabling the desired chip.

As described and illustrated in the above patents, various methods have been implemented for more closely "bonding" electronic components such as semiconductor chips and a substrate as one integral assembly, including the use of chip "recesses" with an appropriate cover or like material and, more specifically, as seen in some of these patents, use of internal chip placement and coupling amongst the substrate's layered structure itself. As also described in some of the patents above, placement of chips atop a circuit board, including within a "stacked" orientation, is also known.

The present invention, as defined below in greater detail, represents a significant advancement over the above structures and methods by providing a circuitized substrate assembly in which two or more microprocessors (semiconductor chips) are integrally formed as part of the substrate's multi-layered structure and capable of effectively operating in conjunction with other components located atop and/or externally of the substrate, if desired. The formed substrate assures effective coupling of the integrally formed chips to conductive layers (e.g., signal lines, power or ground planes, etc.) of the substrate. The invention is able to do so expeditiously in such a manner that the method of forming the substrate can be carried out using many known PCB manufacturing processes with relatively little modification thereto, thus assuring a final product without a corresponding relatively high cost. The invention so defined is also able to provide internal chips capable of being electrically coupled to such external components with little or no signal "noise" and with significantly reduced impedance.

In general, any structure that allows a signal to propagate from one point to another may be defined as a transmission line (in a PCB, such a line may be referred to as a "trace" if part of a substrate conductive layer, a plated "thru-hole" (PTH) if rendered conductive (e.g., plated with a metal such a copper), or even a conductive plane (e.g., power or ground) if in substantially solid, planar configuration. As a signal propagates along this line, both voltage and current are present. The ratio of these two parameters is understood to represent the characteristic impedance of the line, which is a property determined solely by the material and geometry of the line and the insulating materials which surround the lines. The characteristic impedance is proportional to the ratio of the inductance and capacitance of the line. In general, impedance is dependent upon frequency, but for lines that are essentially lossless, it can be considered constant. In signal lines, including PTHs for coupling "traces" with other "traces" on different conductive layers, ideally the signal arriving at the receiving end will be the same as that which entered the line at the driver end. However, if the transmission line changes characteristic impedance at any point along the way, signal behavior becomes more complicated. At the interface where such an impedance change occurs, partial reflections of the signal will be created. These reflected waves will travel back toward the source for possible reflection a second time. At each interface where an impedance change occurs, a reflected signal will thus be created. The reflections caused by these impedance mismatches have the ability to alter the original signal transmission, even possibly causing such problems as logic circuits to switch inadvertently. Furthermore, as signal "rise times" drop below a certain level (in highly dense PCB structures, 1 nanosecond (ns)), PCB thru-holes, including the relatively short internal "vias" mentioned above, may possibly create large enough reflections as to potentially cause significant signal transmission concerns. Consequently, as clock rates increase and signal rise times become short, as is currently being demanded in many of today's products, all portions of the interconnection path need to be well matched to the impedances of the other parts of the substrate and to the electronic components these lines interconnect.

With particular attention to internal or other "vias" (as stated, all referred to as thru-holes herein), the capacitance created is by way of a stray electric field present between the via and the various power, ground or signal layers in the PCB. The inductance of the via is related to the magnetic field surrounding the portion of the via carrying the signal current. Typically, the inductance of the via is quite small relative to its capacitance. As such, most vias exhibit very low impedance and are a poor match to typical PCB traces. Reducing the via's capacitance or increasing the via's inductance will raise the via's impedance and create an improved match. This improvement will improve the capability to carry higher data rates from the internally positioned chip(s) through the via(s) to the substrate's external surfaces and thus to external components coupled to the substrate. The unique structure of the instant invention is able to provide effective coupling between two or more internal semiconductor chips and, possibly, external components (if used) while substantially overcoming the aforementioned problems associated with other structures. This is believed especially significant when considering the highly dense orientation of the chips as defined herein, relative to both each other and the thru-holes and other conductive medium used herein, as well as the extremely small dimensions for such elements.

It is believed that such a substrate, method of making same, and various products utilizing same will constitute significant advancements in the art.

OBJECTS AND SUMMARY OF THE INVENTION

It is, therefore, a primary object of the present invention to enhance the circuitized substrate art.

It is another object of the invention to provide a circuitized substrate which includes at least one (and possibly several) internally positioned semiconductor chips, oriented in a specified manner for enhanced interconnection purposes, capable of being also electrically coupled to external components such as those used in various information handling systems adapted for utilizing the substrate.

It is another object of the invention to provide a method of making such a substrate and internal chip combination which can be accomplished utilizing many known PCB manufacturing processes (some with only relatively minor modification) and thus without a significant increase in the cost for making such a relatively complex final structure.

It is yet another object of the invention to provide various assemblies which effectively utilize one or more of the circuitized substrates having the unique features taught herein.

According to one embodiment of the invention, there is provided a circuitized substrate assembly comprising a first circuitized substrate including at least one thin dielectric layer and at least one conductive layer, the conductive layer including a first plurality of conductive members, a first semiconductor device including a plurality of conductive sites thereon, selected ones of these conductive sites being electrically coupled to corresponding ones of the conductive members of the first circuitized substrate, a second circuitized substrate also including at least one thin dielectric layer and at least one conductive layer in which the conductive layer includes a second plurality of conductive members, a second semiconductor device including a plurality of conductive sites thereon, selected ones of these conductive sites being electrically coupled to corresponding ones of the conductive members of the second circuitized substrate, and at least one dielectric layer positioned substantially between the first and second circuitized substrates, the first and second circuitized substrates being bonded together to form the circuitized substrate assembly such that the first and second semiconductor chips are internally positioned within the assembly in a substantially stacked orientation.

According to another embodiment of the invention, there is provided a method of making a circuitized substrate assembly comprising providing a first circuitized substrate including at least one thin dielectric layer and at least one conductive layer, the conductive layer including a first plurality of conductive members, providing a first semiconductor device including a plurality of conductive sites thereon, electrically coupling selected ones of the first plurality of conductive members to corresponding ones of the conductive sites on the first semiconductor device, providing a second circuitized substrate including at least one thin dielectric layer and at least one conductive layer, this second conductive layer including a second plurality of conductive members, providing a second semiconductor device including a plurality of conductive sites thereon, aligning the first and second circuitized substrates and the first and second semiconductor devices in a predetermined orientation, positioning at least one dielectric layer substantially between the first and second circuitized substrates, and thereafter bonding the first and second circuitized substrates together to form a circuitized substrate assembly.

According to still another embodiment of the invention, there is provided an electrical assembly including a circuitized substrate assembly comprising a first circuitized substrate including at least one thin dielectric layer and at least one conductive layer, the conductive layer including a first plurality of conductive members, a first semiconductor device including a plurality of conductive sites thereon, selected ones of these conductive sites being electrically coupled to corresponding ones of the conductive members of the first circuitized substrate, a second circuitized substrate also including at least one thin dielectric layer and at least one conductive layer in which the conductive layer includes a second plurality of conductive members, a second semiconductor device including a plurality of conductive sites thereon, selected ones of these conductive sites being electrically coupled to corresponding ones of the conductive members of the second circuitized substrate, and at least one dielectric layer positioned substantially between the first and second circuitized substrates, the first and second circuitized substrates being bonded together to form the circuitized substrate assembly such that the first and second semiconductor chips are internally positioned within the assembly in a substantially stacked orientation, and at least one electrical component positioned on said circuitized substrate assembly and electrically coupled to said circuitized substrate assembly.

According to yet another embodiment of the invention, there is provided an information handling system, the system including a housing, an electrical assembly positioned within said housing, the assembly including a circuitized substrate assembly comprising a first circuitized substrate including at least one thin dielectric layer and at least one conductive layer, the conductive layer including a first plurality of conductive members, a first semiconductor device including a plurality of conductive sites thereon, selected ones of these conductive sites being electrically coupled to corresponding ones of the conductive members of the first circuitized substrate, a second circuitized substrate also including at least one thin dielectric layer and at least one conductive layer in which the conductive layer includes a second plurality of conductive members, a second semiconductor device including a plurality of conductive sites thereon, selected ones of these conductive sites being electrically coupled to corresponding ones of the conductive members of the second circuitized substrate, and at least one dielectric layer positioned substantially between the first and second circuitized substrates, the first and second circuitized substrates being bonded together to form the circuitized substrate assembly such that the first and second semiconductor chips are internally positioned within the assembly in a substantially stacked orientation, and at least one electrical component positioned on said circuitized substrate assembly and electrically coupled to said circuitized substrate assembly.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

The following terms will be used herein and are understood to have the meanings associated therewith.

By the term "circuitized substrate" is meant to include substrates having at least one thin dielectric layer and one conductive layer, the latter including a plurality of conductive pads. In some cases, such substrates may include several dielectric and conductive layers. Examples include flexible circuit structures made of dielectric materials such as polyimide and other like materials wherein the conductive layer is a metal layer (e.g., signal plane) comprised of conductive pads formed from suitable metallurgical materials such as copper but may include or comprise additional metals (e.g., tin, gold) or alloys thereof. By the term "thin" when used to define the thickness of such dielectric layers is meant a thickness of from about 0.1 mil to about ten mils. Such a term is also meant to include a flexible structure.

By the term "circuitized substrate assembly" as used herein is meant to include at least two of such circuitized substrates in a bonded configuration, one example of such bonding being conventional lamination procedures known in the art.

By the term "electrical assembly" is meant at least one circuitized substrate assembly as defined herein in combination with at least one electronic component electrically coupled thereto and forming part of the assembly. Examples of known such assemblies include chip carriers which include a semiconductor chip as the electronic component, the chip usually positioned on the substrate and coupled to wiring (e.g., pads) on the substrate's outer surface or to internal conductors using one or more thru-holes. In one particular example of the present invention, this external semiconductor chip may be an Application-Specific Integrated Circuit (ASIC) chip, while in other examples, it may be a network processor or RF (radio frequency) die.

By the term "electrically conductive paste" as used herein is meant to include a bondable (e.g., capable of lamination) conductive material capable of being dispensed within openings of the type taught herein. Typical examples of bondable electrically conductive material are conductive pastes such as silver filled epoxy paste obtained from E.I. duPont deNemours and Company under the trade designation CB-100, Ablebond 8175 from the Ablestick Company and filled polymeric systems, thermoset or thermoplastic type, containing transient liquid conductive particles or other metal particles such as gold, tin, palladium, copper, alloys, and combinations thereof. One particular example is coated copper paste.

By the term "electrical component" as used herein is meant components such as resistors, capacitors and the like, and even semiconductor chips, which are adapted for being positioned on the external conductive surfaces of such substrates and possibly electrically coupled to the internally positioned chips, as well as to each other. Such components may form part of an information handling system in which the circuitized substrate assembly defined herein is adapted for use.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more substrates, e.g., PCBs, as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

By the term "sculpted" as used herein is meant a final external configuration of a metallic contact formed by etching (e.g., differential gray scale etching, such as described in U.S. Pat. No. 6,156,484) in which various designated surface areas are etched at different rates) to form the final, different final external configuration. The final configuration will typically include a plurality of projections, defined by a corresponding plurality of grooves, slots or similar indentations therein. This definition is not meant to include a rounded domed shape or other shape having an entirely smooth, uninterrupted exterior surface. This contact, as understood from the following, is capable of penetrating, even if only partially, the surface of a contact such as a solidified solder ball.

By the term "sticker sheet" as used herein is meant to include dielectric materials which do not include continuous glass fibers or the like therein, and which can be utilized in conventional lamination processing. Examples include liquid crystal polymer (LCP) or other freestanding films such as polyimide. These dielectric sticker sheets may be adhesively applied to one or both of the two circuitized substrates to assist in bonding these two substrates and may even be patterned, e.g., by laser or photoimaging, if desired. Such sticker sheets as used herein may be typically only from about 0.5 mils to about ten mils thick.

Figure 1:
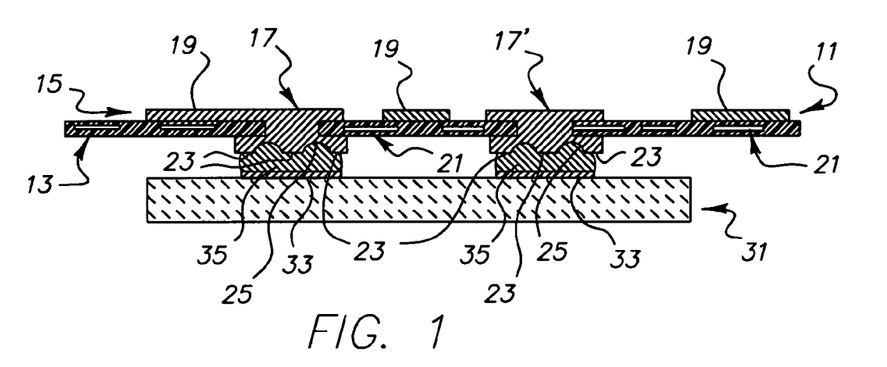
FIG. 1 is a much enlarged, side elevational view, in section, illustrating a circuitized substrate according to one embodiment of the invention, said substrate shown as being coupled to a semiconductor chip.

In FIG. 1, there is shown a circuitized substrate 11 according to one embodiment of the invention. Substrate 11 is shown to include at least one thin, flexible layer 13 of dielectric material having thereon an electrically conductive layer 15 which is an electrical circuit including a plurality of conductive members 17 and 17'. Conductive layer 15 may further include other conductive elements, such as signal lines (i.e., 19, which is coupled to member 17) or pads. If signal lines are used, these may have a width of as little as from about one mil to about 3 mils. In a preferred embodiment, layer 13 is comprised of polyimide and may have a thickness of only from about 0.5 mils to 10 mils (a mil being one thousandth of an inch). Width and length dimensions for layer 13 will vary depending on the operational requirements of the product in which it is to be utilized (defined more below). In one example, thin layer 13 may possess a width of about two inches and a length of about two inches. It is also possible for layer 13 to include therein one or more conductive layers 21 and, in such an example, these layers may function as signal, power and/or ground layers, with signal layers being most likely utilized. If layer 21 is a signal layer, it, like layer 15, may include various conductive elements such as signal lines and pads or the like as part thereof. Several such elements are illustrated in layer 13 in FIG. 1. The conductive layers shown in FIG. 1 are preferably of copper or copper alloy, as is conventionally utilized in PCB and chip carrier technologies, but may be of other metals, if desired. If internal conductive layers are used, one or more may in turn be electrically coupled to one or more of the conductive members 17 and 17'. In FIG. 1, the internal layer is shown coupled to the right member 17'.

The circuitry for conductive layers 15 and 21 (if used) may be formed using conventional photolithographic processing known in the PCB and chip carrier arts. Further definition is not considered necessary.

In one embodiment of the invention, a total of 2000 conductive members (17, 17') may be used, each positioned only about six mils apart (center-to-center) from one another in a pre-defined pattern. This number and spacing is not limiting because more or fewer members may be utilized, again, depending on operational requirements. A suitable pattern may be rectangular, but this also is not limiting. The example cited is clearly illustrative of the high density of conductive members attainable by the invention, which is deemed particularly significant considering such placement is necessary for effective coupling to one or more semiconductor devices, as defined below. The present invention is thus able to satisfy the miniaturization requirements demanded in so many of today's product offerings. In one example, each conductive member (17, 17') is of substantially annular configuration, having a diameter of from about three mils to about six mils and a thickness of only about one mil. As shown in FIG. 1, each member 17, 17' is of sculpted configuration, and includes a plurality of projections 23 on the lower surface thereof, as defined by a corresponding number of grooves 25 within this lower surface. Projections and grooves may be formed by the aforementioned gray scale etching process such as described in U.S. Pat. No. 6,156,484.

Circuitized substrate 11 includes at least one semiconductor device 31 electrically coupled thereto. Device 31 is preferably a memory semiconductor chip but may be another electrical component, including another type of chip (e.g., ASIC). In one embodiment, device 31 is a memory chip of very thin design, having a thickness of only from about two mils to about six mils. Device 31 includes a plurality of conductive sites 33 (although only two are shown in FIG. 1, many more are part of this component, particularly if device 31 is a chip). Each site is of a sound conductive material, with examples including aluminum, copper, etc. Coupling to substrate 11 is accomplished using a solder member 35 which is bonded to each respective site. Member 35 is preferably in the form of a solder ball, as is known for coupling semiconductor chips, e.g., onto chip carriers and PCBs. A solder ball is provided on each site to assure a proper connection to substrate 11, which will in turn include an equal number of conductive members because in the embodiment shown in FIG. 1, it is desired to connect each conductive member to a respective chip site. The solder balls are formed on each site using a conventional solder dispense procedure, following a flowing of the solder to form the ball shape. Such flowing may be accomplished using a conventional convection oven or the like. In one example, each solder ball is comprised of 90-10 tin-lead solder, a solder composition known in the chip and PCB art. Significantly, once the solder members assume the ball-like (and thus solid) configuration, substrate 11 is aligned relative to device 31 such that each conductive member (17, 17') slightly engages the upper surface of a respective solder member. Pressure is then exerted on the substrate and chip such that each conductive member will partially embed within the respective solder, forming an effective mechanical and electrical connection. Such a connection is facilitated using the sculpted portions of the conductive members, which partially penetrate the solidified solder ball, while still retaining their original projecting configurations.

The substrate-chip structure of FIG. 1 is now ready for testing, and various types of testing are known in the art. If this testing indicates a defective chip, the chip is easily removed from the substrate and a new chip positioned thereon. Such removal may be accomplished by a mechanical prying device inserted between the chip and substrate. Re-attachment to a new chip is then attainable using pressure application as was provided for the initial chip coupling. Once the substrate-chip structure has successfully passed the requisite testing, it is also possible to re-flow the solder members to form a more permanent coupling. Such re-flow may occur within a conventional convection oven and, in one example, may occur at a temperature of from about 183 degrees Celsius (herein also referred to simply as C) to about 320 degrees C., and for a time period of from about 0.3 minutes to about two minutes. In a more particular example, the temperature was about 302 degrees C. and the time period one minute. It is to be understood that the re-flow operation is optional, as the mechanical connection formed by conductor penetration of the solder balls will assure a connection suitable for further processing of the type defined below. Re-flow of the solder, causing it to flow and likely cover more surface area of the respective conductive members, will enhance such a coupling.

Figure 2:
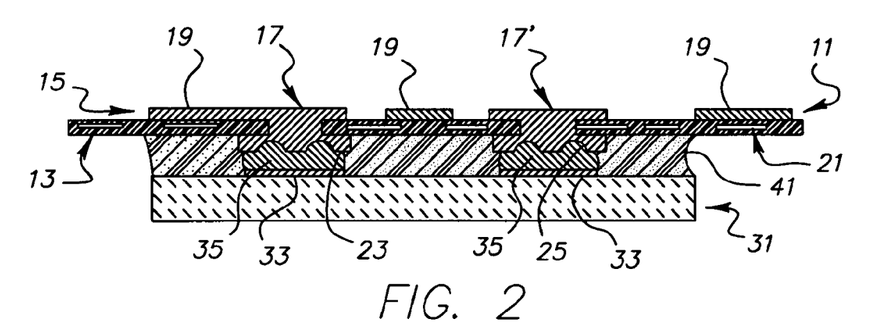
FIG. 2 is a much enlarged, side elevational view, in section, illustrating the substrate and chip of FIG. 1 further including a quantity of underfill positioned thereon.

In FIG. 2, the substrate 11 and chip 31 structure includes a quantity of underfill material 41 positioned between the thin, flexible dielectric layer and the chip's upper surface. The underfill is preferably a product sold under the name Hysol FP4549SI and is available from Henkel Technologies, having a place of business at Irvine, Calif. Other underfill materials are acceptable. The underfill 41 serves to maintain the circuitized substrate in a substantially parallel orientation above the planar upper chip surface while relieving strain on the chip connections. Underfill material 41 is preferably dispensed using conventional equipment known for such purposes, e.g., dispense under a chip mounted on a chip carrier or PCB using known solder ball technologies (e.g., controlled collapse chip connection, or "C4" technology). Further definition is not considered necessary.

Figure 3:
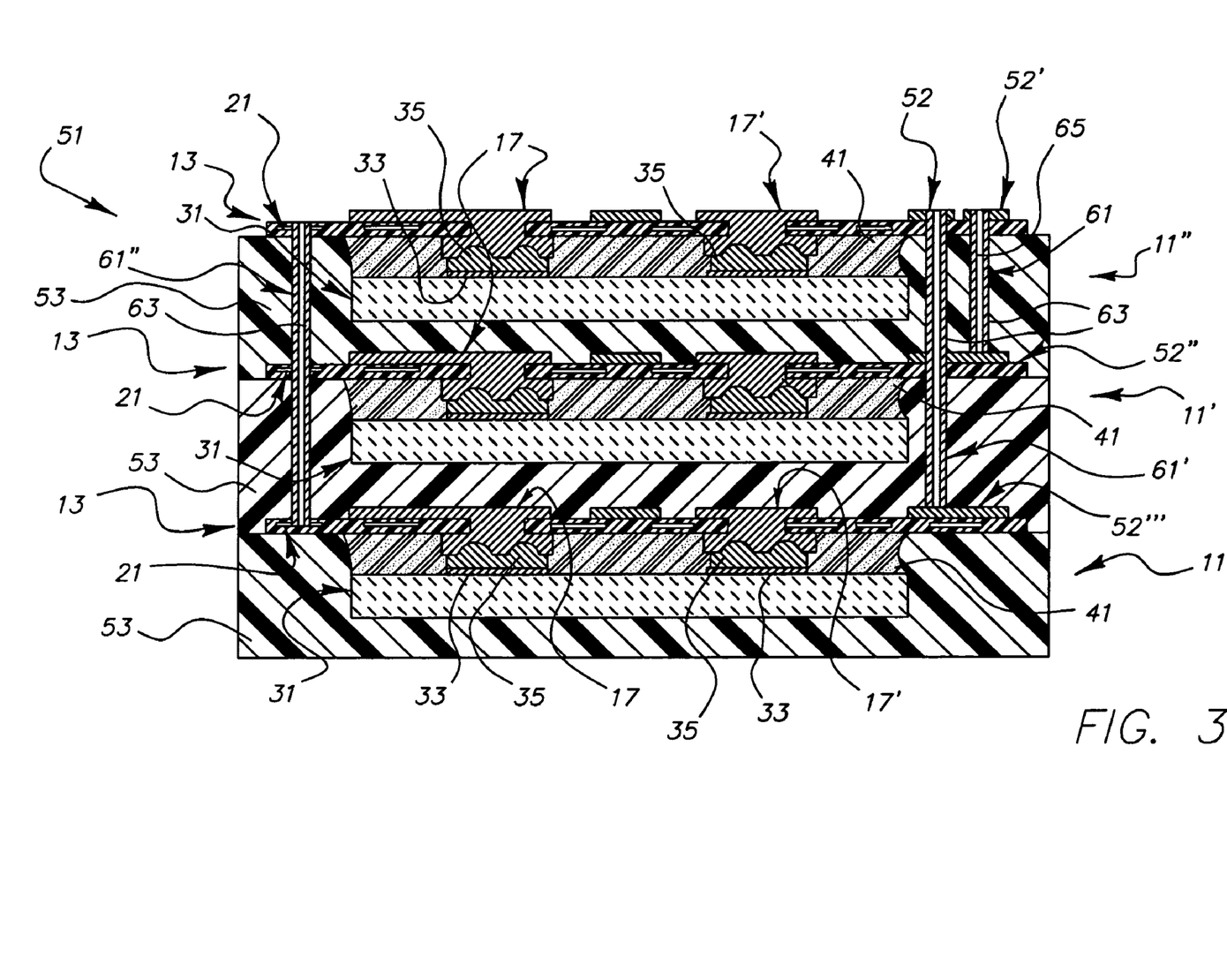
FIG. 3 is a side elevational view, in section and on a slightly reduced scale over the views of FIGS. 1 and 2, illustrating a circuitized substrate assembly according to one embodiment of the invention, said assembly including a plurality of circuitized substrates similar to the one shown in FIGS. 1 and 2.

In FIG. 3, there is shown a circuitized substrate assembly 51 according to one embodiment of the invention. As shown, assembly 51 includes at least two, and possibly more (three shown in FIG. 3) circuitized substrates (11, 11' and 11") and attached semiconductor devices 31 as part thereof. In one embodiment, four such structures may be used to form the assembly, and it is further possible to add even more such structures, depending on the required operational features for the final product. As shown, each circuitized substrate may have different conductive planes both internally and externally, i.e., as evidenced by the different signal line/pad structures to the right on each dielectric layer. The first (upper) substrate includes two adjacent pads/signal line elements 52 and 52', while the interim substrate 11' includes a single pad/signal line 52". In comparison, lower substrate 11, similar to that shown in FIGS. 1 and 2, includes a longer width signal line/pad 52''' similar to signal line/pad 19. Different conductive plane elements are desired depending on the interconnecting used to couple respective conductive layers, including possibly those internally located (if utilized) within the respective thin dielectric layers. It is further possible to use different conductive members for the various substrates, in addition to or in place of the sculpted members 17 and 17'. One example of such an alternative conductor will be defined with the description of FIG. 6 below. The configurations depicted in FIG. 3 are thus intended to represent that several such alternatives are possible and the invention is not particularly limited to these as shown in both configuration and relative alignment.

Assembly 51 is formed by aligning each of the substrate-chip subassemblies relative to one another (i.e., directly above each other in a stacked orientation as seen in FIG. 3), placing a dielectric layer 53 between each aligned pair. A layer 53 is also provided under the lowermost semiconductor 31. The aligned structure is then subjected to lamination processing similar to that used in the formation of multi-layered PCB manufacture. Each layer 53 is thus a "sticker sheet" as defined above. Preferred materials of layers 53 include organic polymer materials, with more preferred examples being polyimide and liquid crystal polymer material. One specific polyimide is available under the product name Pyralux AP from E.I. DuPont deNemours and Company, having a place of business in Wilmington, Del. One specific example of a liquid crystal polymer (LCP) is sold under the product name Ultralam 3000 series by the Rogers Corporation, having a place of business in Rogers, Conn. Other examples of such materials are also possible. In the example of FIG. 3, when using the elements for the substrates, conductive layers and semiconductor devices defined above, lamination of the LCP material may be accomplished at a temperature of from about 275 degrees C. to about 325 degrees C. within a time period of from about thirty minutes to about ninety minutes. In a more specific example, a temperature of about 285 degrees C. and a time period of sixty minutes may be utilized.

It is also possible during this lamination to re-flow the solder members, e.g., if said members have not been re-flowed earlier as defined above. Such re-flow is also possible at this stage, despite the presence of the surrounding underfill material. The temperatures generated from the lamination processing are sufficient to achieve such re-flow.

The next step of forming the circuitized substrate assembly 51 involves the provision of thru-holes 61, 61' and 61" within the structure. These thru-holes are preferably formed using conventional PCB technology in which individual holes are first drilled (e.g., preferably using lasers or, alternatively, mechanical drills) within the substrate to the required depths, after which a conductive thin layer 63 (e.g., copper) is plated (e.g., using electro-less of electrolytic plating) onto the surfaces of the openings. Such hole formation and subsequent plating are known processes in the PCB and chip carrier art, and further description is not considered needed. In one embodiment, each thru-hole may possess a diameter of only about two mils to about six mils, with a plating thereon of a thickness of only about 0.5 mils. In FIG. 3, three thru-holes 61, 61' and 61" are shown, but it is understood that several more may be provided, again depending on how many interconnections between respective substrates and other conductive elements (including external electrical components, as defined below) are required. The invention is not limited to using only three, or to those of the particular depths and connections shown in FIG. 3. In addition to the plating material 63, or in lieu thereof, it is also possible to utilize electrically conductive paste 65 (shown only in thru-hole 61) within the thru-holes. Such paste will serve to enhance the connections formed by the plated metallurgies to the respective conductors, but, if used in lieu of the platings, may serve alone as the conductive medium between conductors.

In FIG. 3, thru-hole 61 couples substrate 11" to substrate 11', while thru-hole 61' extends deeper with the assembly to couple all three substrates 11, 11' and 11", and more particularly, the upper pads/signal lines on the upper surfaces thereof. Thru-hole 61" is provided to show that connections are also possible using thru-holes to interconnect the internal conductive layers 21 of each substrate. Because the semiconductor devices 31 are also electrically coupled to a respective circuitized substrate (11, 11' or 11"), the thru-holes in turn are electrically coupled to these devices, such that each device may in turn be coupled to another device (or more than one), or, alternatively, the devices may each be coupled to an external electrical component 71, such as an ASIC chip shown in FIG. 4. It bears stating once again that the various connection schemes depicted herein are representative of the fact that many combinations of connections are possible.

Figure 4:
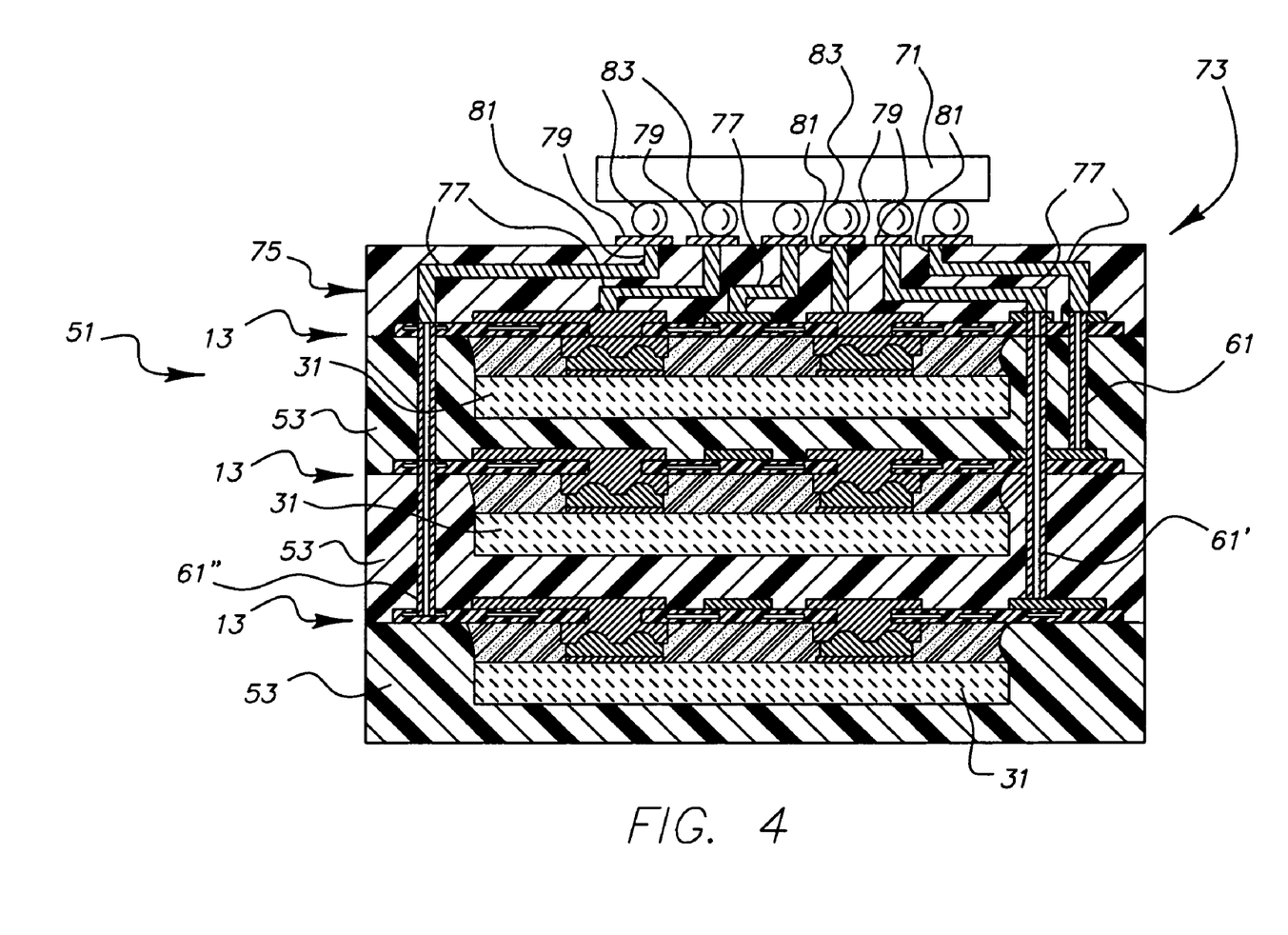
FIG. 4 is a side elevational view, in section and on a slightly reduced scale over the view of FIG. 3, illustrating an electrical assembly according to one embodiment of the invention.

FIG. 4 represents one example of an electrical assembly 73 of the invention. In this example, the aforementioned ASIC chip 71 is positioned atop a substrate 75 which in turn is positioned atop circuitized substrate assembly 51. Preferably, substrate 75 comprises a plurality of dielectric layers (e.g., of the dielectric materials cited above) and conductive layers 77 (e.g., copper lines) much the same as a conventional PCB construction, meaning the layers are arranged in an alternating manner. While three layers 77 are shown, it is possible (and likely preferred) to utilize more, depending on the connection requirements to the respective electrical component 71, or, possibly components, if more than one component is used. In the simplistic example shown, each of the layers 71 fan out from a localized pattern of conductors 79 formed on the top surface of substrate 75. Substrate 77 is formed using conventional lamination processing, and may be formed concurrently with the laminating of individual substrates 11, 11' and 11" with interim sticker sheets 53. Connections between layers 77 may be provided using thru-holes, represented by the numeral 81. Each thru-hole is preferably drilled and metallized similar to thru-holes 61, 61' and 61". Electrical component 71 is attached to the pattern of conductors 97 using solder balls 83. A convention solder composition such as 63-37 tin-lead solder may be used, which may be initially deposited on the conductors 79 and then flowed in a conventional convection oven to solidify and bond to the conductive sites (not shown) located on the undersurface of component 71. Such sites, e.g., aluminum pads, are well known in chip technology and further description is not considered necessary. Component 71 may be coupled to conductors 79 by different means, including wire-bonding, another known means for coupling chips onto substrates.

It is also possible to couple component 71 to assembly 51 without using substrate 75, by directly positioning the component on the upper substrate 11" and bonding it to designated pads thereon, including conductive members 17 and 17'. The circuitry on the upper surface of the substrate could be modified from the pattern shown to provide a pattern similar to that of the conductive sites of component 71, with a solder connection between pairs of such sites and conductive members and/or pads. The present invention thus presents several advantageous possibilities for providing connections between the various conductive elements thereof as well as those used in conjunction therewith. The invention is not limited to using an ASIC chip for component 71, as other electrical components, including a chip carrier having one or more semiconductor chips thereon, may be successfully utilized. The electrical assembly 73 of FIG. 4 is thus able to provide interconnections between various semiconductor chips, including both memory and ASIC, to provide a final assembly with significant processing capabilities. Such an assembly is thus especially adaptable for use in many of today's information handling systems which demand more and more processing capabilities.

Figure 5:
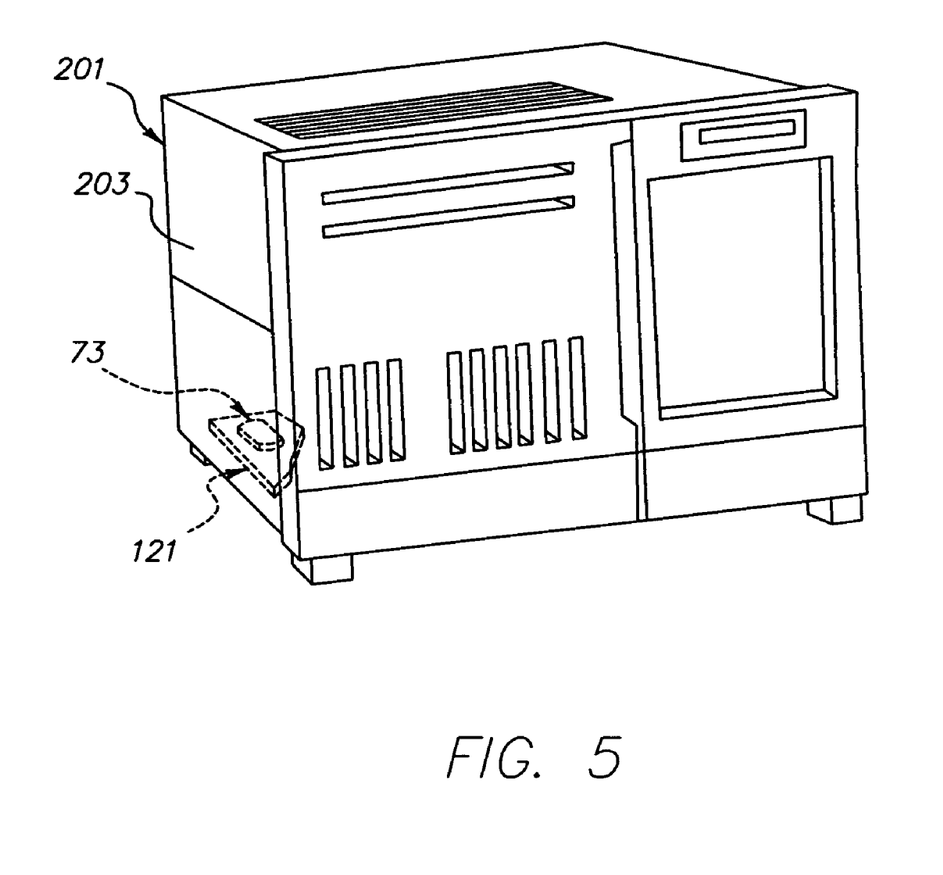
FIG. 5 is a perspective view, on a much reduced scale over the view of FIG. 4, illustrating an information handling system having at least one of the electrical assemblies of FIG. 4 as part thereof.

In FIG. 5, there is shown one example of such an information handling system, represented by the numeral 201. System 201 may comprise a personal computer, mainframe computer, computer server, or the like, several types of which are known in the art. System 201, as taught herein, may include one or more of the electrical assemblies 73 shown in FIG. 4. One such assembly 73 is shown (hidden) positioned within the housing 203 which is usually used to contain and protect the internal components of such systems. This assembly may in turn be mounted on a larger PCB or other substrate such as PCB 121 in FIG. 4. PCB 121 may form a "motherboard" in system 201 and thus include additional PCBs and assemblies such as assembly 73 as part thereof. It is thus seen and understood that the circuitized substrate assembly made in accordance with the unique teachings herein may be utilized in several various structures, including as part of a much larger system such as information handling system. Further description is not believed necessary.

Figure 6:
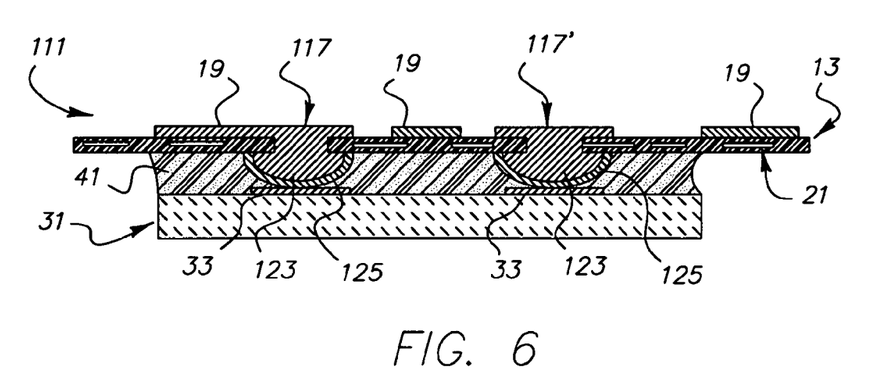
FIG. 6 is a much enlarged, side elevational view, in section and on a scale similar to that of FIG. 1, illustrating a circuitized substrate according to another embodiment of the invention, said substrate shown as being coupled to a semiconductor chip.

FIG. 6 represents an alternative embodiment of a circuitized substrate which may be utilized to form a larger circuitized substrate assembly of the invention. Substrate 111 includes many of the elements of substrate 11 in FIG. 1, including, possibly, internal conductive planes 21 and is coupled to a semiconductor device 31. Substrate 111 differs from substrate 11, however, due to use of a different form of conductive members. These members, represented by the numerals 117 and 117', are not of the sculpted type, but instead include a domed contacting portion 123 having thereon at least one layer of metallurgy 125. Metallurgy 125 may be a tin layer and may further include a thin layer of gold thereon. Once chip 31 has been tested, the substrate 13 is aligned relative to the chip such that conductive members engage the respective conductive sites 33 of the chip. Heat is then applied sufficiently to cause a transient liquid phase bonding between the metallurgies of the conductive members and those of the corresponding site 33, thereby forming a fixed bond once the connections are allowed to cool. In one example, the structure of FIG. 6 was heated to a temperature of from about 180 degrees C. to about 300 degrees C. for a time period of from about 0.3 minutes to about two minutes, to effect the bonds. In a particular example, substrate 111 was heated to a temperature of 250 degrees C. for a time period of one minute. Other metals, e.g., lead, palladium, silver or tin-lead alloy, may be used in place of or in combination with the tin and/or gold. In the embodiment shown, each conductor 117 and 117' may have a layer of this metallurgy at a thickness of about 0.2 mils of tin with several microinches of gold.

Thus there has been shown and described a circuitized substrate assembly which provides, uniquely, for the formation of several internal semiconductor devices, e.g., memory chips, which in turn may be coupled to another component such as an ASIC chip to provide a product having significantly increased micro-processing capabilities when used in such end products as information handling systems. The circuitized substrate assembly taught herein is formed, for the most part, using conventional PCB and chip carrier technologies with relatively minor modification thereto and thus result in an end product possessing significant capabilities but which is attainable at relatively low cost compared to many multi-chip components. Significantly, the circuitized substrate assembly taught also provides protection for the internally positioned semiconductor devices, e.g., from the often harsh environments in which many information handling systems are used. Still further, the assemblies as produced herein are capable of transmitting both regular and high speed (frequency) signals, the latter at a rate of from about one Gigabits/sec to about ten Gigabits/second (or even more), while substantially preventing impedance disruption and the other problems described hereinabove. It is believed that this invention, therefore, represents a significant advancement in the art for these reasons and others discernible from the teachings herein.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate assembly comprising:
   a first circuitized substrate including at least one thin dielectric layer and at least one conductive layer, said conductive layer including a first plurality of conductive members;
   a first semiconductor device including a plurality of conductive sites thereon, selected ones of said conductive sites being soldered to corresponding ones of said first plurality of said conductive members of said conductive layer of said first circuitized substrate;
   a second circuitized substrate including at least one thin dielectric layer and at least one conductive layer, said at least one conductive layer of said second circuitized substrate including a second plurality of conductive members;
   a second semiconductor device including a plurality of conductive sites thereon, elected ones of said conductive sites of said second semiconductor device being electrically coupled to corresponding ones of said second plurality of said conductive members of said conductive layer of said second circuitized substrate; and
   at least one dielectric layer being positioned substantially between said first and second circuitized substrates, said first and second circuitized substrates being bonded together to form said circuitized substrate assembly, said first and second semiconductor chips being internally positioned within said assembly in a substantially stacked orientation;
   wherein each of said conductive members of said first and second plurality of conductive members is sculpted.

2. The circuitized substrate assembly of claim 1 wherein said at least one thin dielectric layer of each of said first and second circuitized substrates is comprised of an organic polymer material.

3. The circuitized substrate assembly of claim 1 wherein each of said first and second semiconductor devices comprises a memory chip.

4. The circuitized substrate assembly of claim 1 further including a quantity of underfill material positioned between each of said first and second semiconductor devices and said thin dielectric layers of said first and second circuitized substrates, respectively.

5. The circuitized substrate assembly of claim 1 wherein said at least one dielectric layer positioned substantially between said first and second circuitized substrates is comprised of an organic polymer material.

6. The circuitized substrate assembly of claim 2 wherein said organic polymer material comprises polyimide.

7. The circuitized substrate assembly of claim 2 wherein said at least one conductive layer of each of said first and second circuitized substrates is comprised of copper or copper alloy.

8. The circuitized substrate assembly of claim 3 wherein the number of said memory chips is at least four.

9. The circuitized substrate assembly of claim 5 wherein said organic polymer material comprises polyimide.

10. The circuitized substrate assembly of claim 5 wherein said organic polymer material comprises a liquid crystal polymer.

11. A method of making a circuitized substrate assembly, said method comprising:
    providing a first circuitized substrate including at least one thin dielectric layer and at least one conductive layer, said conductive layer including a first plurality of conductive members;
    providing a first semiconductor device including a plurality of conductive sites thereon; soldering selected ones of said first plurality of conductive members to corresponding ones of said conductive sites on said first semiconductor device;
    providing a second circuitized substrate including at least one thin dielectric layer and at least one conductive layer, said conductive layer of said second circuitized substrate including a second plurality of conductive members;

providing a second semiconductor device including a plurality of conductive sites thereon;

aligning said first and second circuitized substrates and said first and second semiconductor devices in a predetermined orientation;

positioning at least one dielectric layer substantially between said first and second circuitized substrates; and thereafter bonding said first and second circuitized substrates together to form said circuitized substrate assembly;

further including providing a plurality of solder members, each of said selected ones of said solder members being positioned on a respective one of said conductive sites of said first semiconductor device, and said selected ones of said conductive members are sculpted, said positioning of said selected ones of said first plurality of conductive members to said corresponding ones of said conductive sites on said first semiconductor device being accomplished by pressing said conductive members into said solder members.

12. The method of claim 11 wherein said electrically coupling said selected ones of said first plurality of conductive members to said corresponding ones of said conductive sites on said first semiconductor device is accomplished mechanically.

13. The method of claim 11 further including re-flowing each of said solder members following said electrically coupling by said pressing of said conductive members Into said solder members.

14. The method of claim 11 wherein said electrically coupling said selected ones of said second plurality of conductive members to said corresponding ones of said conductive sites on said second semiconductor device is accomplished mechanically.

15. The method of claim 11 further including re-flowing each of said solder members positioned on and a respective one of said conductive sites of said second semiconductor device following said positioning by said pressing of said conductive members of said second circuitized substrate into said solder members.

16. The method of claim 11 further including positioning quantity of underfill material between each of said first and second semiconductor devices and said thin dielectric layers of said first and second circuitized substrates, respectively.

17. The method of claim 11 wherein said bonding of said first and second circuitized substrates together to form said circuitized substrate assembly is accomplished using a lamination process.

18. The method of claim 11 wherein said aligning said first and second circuitized substrates and said first and second semiconductor devices in said predetermined orientation comprises aligning said first and second semiconductor devices in a stacked orientation wherein said first semiconductor device is oriented above said second semiconductor device.

19. An electrical assembly comprising:

a circuitized substrate assembly including a first circuitized substrate including at least one thin dielectric layer and at least one conductive layer, said conductive layer including a first plurality of conductive members, a first semiconductor device including a plurality of conductive sites thereon, selected ones of said conductive sites being soldered to corresponding ones of said first plurality of said conductive members of said conductive layer of said first circuitized substrate, a second circuitized substrate including at least one thin dielectric layer and at least one conductive layer, said at least one conductive layer of said second circuitized substrate including a second plurality of conductive members, a second semiconductor device including a plurality of conductive sites thereon, selected ones of said conductive sites of said second semiconductor device being soldered to corresponding ones of said second plurality of said conductive members of said conductive layer of said second circuitized substrate, and at least one dielectric layer being positioned substantially between said first and second circuitized substrates, said first and second circuitized substrates being bonded together to form said circuitized substrate assembly, said first and second semiconductor chips being internally positioned within said assembly in a substantially stacked orientation; and at least one electrical component positioned on said circuitized substrate assembly and soldered to said circuitized substrate assembly;

wherein each of said conductive members of said first and second plurality of conductive members is sculpted.

20. The electrical assembly of claim 19 wherein said at least one electrical component is a semiconductor chip.

21. The electrical assembly of claim 19 further including at least one dielectric layer positioned over said first circuitized substrate and at least one conductive layer positioned within or on said at least one dielectric layer, said at least one electrical component being positioned on said at least one dielectric layer, said at least one conductive layer positioned within or on said at least one dielectric layer electrically coupling said at least one electrical component to said circuitized substrate assembly.

22. The electrical assembly of claim 20 wherein said semiconductor chip of said at least one electrical component is an ASIC semiconductor chip and said first and second semiconductor devices are each memory semiconductor chips.

23. The electrical assembly of claim 21 further including a plurality of thru-holes positioned within said circuitized substrate assembly, selected ones of said thru-holes adapted for soldering selected ones of said circuitized substrates, selected ones of said semiconductor devices and said at least one electrical component.

24. The electrical assembly of claim 23 wherein said at least one electrical component is an ASIC semiconductor chip and said first and second semiconductor devices are each memory semiconductor chips.

25. The electrical assembly of claim 21 wherein the number of said conductive layers positioned within said at least one dielectric layer positioned over said first circuitized substrate is at least two, each of said conductive layers arranged in a fan-out pattern.

26. The electrical assembly of claim 25 further including a plurality of thru-holes positioned within said circuitized substrate assembly, selected ones of said thru-holes adapted for soldering selected ones of said circuitized substrates, selected ones of said semiconductor devices and said at least one electrical component, said selected ones of said thru-holes being soldered to respective ones of said conductive layers positioned within said at least one dielectric layer positioned over said first circuitized substrate.

27. An information handling system comprising:

a housing;

an electrical assembly positioned within said housing and including a circuitized substrate assembly having a first circuitized substrate including at least one thin dielectric layer and at least one conductive layer, said conductive layer including a first plurality of conductive members, a first semiconductor device including a plurality of conductive sites thereon, selected ones of said conductive sites being soldered to corresponding ones of said first plurality of said conductive members of said conductive layer of said first circuitized substrate, a second circuitized substrate including at least one thin dielectric layer and at least one conductive layer, said at least one conductive layer of said second circuitized substrate including a second plurality of conductive members, a second semiconductor device including a plurality of conductive sites thereon, selected ones of said conductive sites of said second semiconductor device being soldered to corresponding ones of said second plurality of said conductive members of said conductive layer of said second circuitized substrate, and at least one dielectric layer being positioned substantially between said first and second circuitized substrates, said first and second circuitized substrates being bonded together to form said circuitized substrate assembly, said first and second semiconductor chips being internally positioned within said assembly in a substantially stacked orientation, and at least one electrical component positioned on said circuitized substrate assembly and soldered to said circuitized substrate assembly;

wherein each of said conductive members of said first and second plurality of conductive members is sculpted.

28. The invention of claim 27 wherein said information handling system comprises a personal computer.

29. The invention of claim 27 wherein said information handling system comprises a mainframe computer.

30. The invention of claim 27 wherein said information handling system comprises a computer server.

31. The invention of claim 27 wherein said at least one electrical component is an ASIC semiconductor chip and said first and second semiconductor devices are each memory semiconductor chips.

\* \* \* \* \*